(12) United States Patent
Zweering

(10) Patent No.: US 11,048,177 B2
(45) Date of Patent: Jun. 29, 2021

(54) PROJECTION EXPOSURE APPARATUS FOR SEMICONDUCTOR LITHOGRAPHY WITH IMPROVED COMPONENT ADJUSTMENT AND ADJUSTMENT METHOD

(71) Applicant: Carl Zeiss SMT GmbH, Oberkochen (DE)

(72) Inventor: Ralf Zweering, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/921,929

(22) Filed: Jul. 6, 2020

(65) Prior Publication Data

US 2020/0333715 A1 Oct. 22, 2020

Related U.S. Application Data

(63) Continuation of application No. PCT/EP2018/085255, filed on Dec. 17, 2018.

(30) Foreign Application Priority Data

Jan. 15, 2018 (DE) .......................... 102018200524.9

(51) Int. Cl.
*G03F 7/20* (2006.01)

(52) U.S. Cl.
CPC ................ *G03F 7/70825* (2013.01)

(58) Field of Classification Search
CPC ............................ G03F 7/70825; G03F 7/707
(Continued)

(56) References Cited

U.S. PATENT DOCUMENTS 4,711,438 A * 12/1987 Guarino .................... B25B 1/06
250/440.11
6,333,775 B1 * 12/2001 Haney ................. G03F 7/70808
277/608
(Continued)

FOREIGN PATENT DOCUMENTS

DE 102009029536 4/2010
DE 102016204143 9/2017

OTHER PUBLICATIONS

German Office Action, with translation thereof, for corresponding DE Appl No. 10 2018 200 524.9, dated Aug. 30, 2018.
(Continued)

*Primary Examiner* — Hung Nguyen
(74) *Attorney, Agent, or Firm* — Fish & Richardson P.C.

(57) ABSTRACT

A projection exposure apparatus for semiconductor lithography includes a component and fixed to a structural part of the apparatus. The component and/or the structural part have/has a stop for bearing against a reference surface at the structural part and/or the component. The stop is movable relative to the component fixed and/or the structural part so that it can be moved away from the reference surface. A method for adjusting a component on a structural part of a projection exposure apparatus includes: securing a stop to the component or the structural part; positioning the component so that the stop comes into mechanical contact with a reference surface at the component or the structural part; fixing the component to the structural part; and moving the stop away from the reference surface.

23 Claims, 4 Drawing Sheets

(58) Field of Classification Search
USPC .................................................. 355/72–76
See application file for complete search history.

(56) References Cited

U.S. PATENT DOCUMENTS

| | | |
|---|---|---|
| 8,305,701 B2 | 11/2012 | Methe et al. |
| 10,168,619 B1 | 1/2019 | Zweering et al. |
| 2004/0027551 A1* | 2/2004 | Barringer ............... G03F 7/707 355/75 |
| 2010/0263192 A1 | 10/2010 | Phillips |

OTHER PUBLICATIONS

International Search Report for corresponding Appl No. PCT/EP2018/085255, filed Apr. 4, 2019.

* cited by examiner

PROJECTION EXPOSURE APPARATUS FOR SEMICONDUCTOR LITHOGRAPHY WITH IMPROVED COMPONENT ADJUSTMENT AND ADJUSTMENT METHOD

CROSS-REFERENCE TO RELATED APPLICATIONS

The present application is a continuation of, and claims benefit under 35 USC 120 to, international application PCT/EP/2018/085255, filed Dec. 17, 2018, which claims benefit under 35 USC 119 of German Application No. 10 2018 200 524.9, filed Jan. 15, 2018. The entire disclosure of these applications are incorporated by reference herein.

FIELD

The disclosure relates to a projection exposure apparatus for semiconductor lithography and to a method for adjusting components of the projection exposure apparatus.

BACKGROUND

Projection exposure apparatuses are often subject to relatively stringent desired properties with respect to imaging accuracy, which is generally dependent on the positioning of the optical elements of a projection exposure apparatus.

In the past, in general, only a few optical elements have been manipulatable, that is to say adjustable in terms of their position. Often, all optical components have been arranged on a structural part or frame, and other components, for example actuators and sensors for manipulating the optical elements, have also been secured to the frame. Increasing desired properties imposed on the projection exposure apparatuses from generation to generation with regard to the positioning of the optical elements have led to the use of a second frame, which serves as a reference for the sensors and the aim of which is to reduce or avoid excitation of the sensors by the actuators and thus impairment of the positioning of the optical components.

Besides the excitation decoupled in this way, the alignment of the actuators and sensors during mounting onto the frames has also typically become more and more important. The accurate alignment of the actuators and sensors during mounting, which is often in up to 6 degrees of freedom, is realized according to some known methods by the use of exchangeable spacers between screw-on points and stops of the actuators and sensors, which are swapped until the sensor and actuator are positioned correctly. In this case, the structural parts have a reference surface, up against which the stops are pushed and then screwed.

This way of aligning and screwing the sensors and actuators can result in stresses being frozen in the course of the sensors and actuators being screwed to the structural part as a result of the contact between the stops and the reference surface, which stresses relax again only over time. Such relaxation can result in a change in the position of the component.

SUMMARY

The present disclosure seeks to provide a projection exposure apparatus and a method in which positioning and screwing of components to a structural part can be realized without residual stresses.

In an aspect, the disclosure provides a projection exposure apparatus for semiconductor lithography. The apparatus includes a component and a structural part of the projection exposure apparatus. The component is fixed on the structural part. The component and/or the structural part have/has at least one stop for bearing against a reference surface at the structural part and/or the component. The stop is movable relative to the component fixed to the structural part and/or the structural part in such a way that it can be moved away from the reference surface. The stop includes a mount and a stop screw arranged in the mount.

In an aspect, the disclosure provides a method for adjusting a component on a structural part of a projection exposure apparatus. The method includes securing at least one stop to the component or the structural part, and positioning the component in such a way that at least one stop comes into mechanical contact with a reference surface at the component or the structural part. The method also includes fixing the component to the structural part, and moving the stop away from the reference surface by turning back a stop screw.

A projection exposure apparatus for semiconductor lithography according to embodiments of the disclosure includes at least one component and a structural part of the projection exposure apparatus, wherein the component is fixed or fixable on the structural part. Furthermore, the component and/or the structural part have/has at least one stop for bearing against a reference surface at the structural part and/or the component. According to the disclosure, the stop is embodied as movable relative to the component fixed to the structural part and/or the structural part in such a way that it can be moved away from the reference surface.

In other words, the stop is embodied in such a way that, after the adjustment of the component, it can be moved away from the component at least to a degree at which it is no longer in mechanical contact with the component and, moreover, forces are no longer transmitted between the stop and the component. In some embodiments, this can avoid undesired changes in the position of the component occur in the case of relaxations of the component on the structural part, that is to say the reduction of mechanical stresses between the component and the reference surface as a result of mechanical creepage.

In certain embodiments of the disclosure, the stop includes a mount and a stop screw arranged in the mount, wherein the stop screw can include a contact surface, which can be convex.

In some embodiments, by virtue of the fact that the stop includes a stop screw, the desired separation between stop and reference surface can be realized in a relatively simple manner by simply turning back the stop screw.

If the stop screw is embodied as adjustable in terms of length, this can result in further options for adjusting the component.

The adjustability of the length of the stop screw can be achieved, for example, by virtue of the fact that the stop screw includes an adjustment screw and a contact screw; in this case, the contact screw can be screwed into an internal thread in the shaft of the adjustment screw.

The change in the length of the stop screw can then be realized by turning and fixing the contact screw in the adjustment screw.

In some embodiments, by virtue of the fact that the contact screw can be embodied as fixable in the adjustment screw via a locking screw, it is possible to achieve an anti-rotation safeguard of the contact screw vis-à-vis the adjustment screw.

Furthermore, in certain embodiments, an anti-rotation safeguard for fixing the stop screw after its movement away from the reference surface can also be present. The anti-rotation safeguard can include an elastically movable element and a cutout for receiving the elastically movable element.

A method according to the disclosure for adjusting a component on a structural part of a projection exposure apparatus includes the following method steps:
  securing at least one stop to the component or the structural part,
  positioning the component in such a way that at least one stop comes into mechanical contact with a reference surface at the component or the structural part,
  fixing the component to the structural part,
  moving the stop away from the reference surface.

In some embodiments, moving the stop away from the reference surface can be carried out by turning back a stop screw.

If appropriate, after the first fixing of the component to the structural part, monitoring of the position of the component on the structural part can be carried out. If a need for correction is ascertained during monitoring, firstly an adaptation of the stop could be effected, whereupon renewed positioning, fixing and monitoring of the position of the component could be carried out.

BRIEF DESCRIPTION OF THE DRAWINGS

Exemplary embodiments and variants of the disclosure are explained in more detail below with reference to the drawings, in which.

DESCRIPTION OF EXEMPLARY EMBODIMENTS

Figure 1:
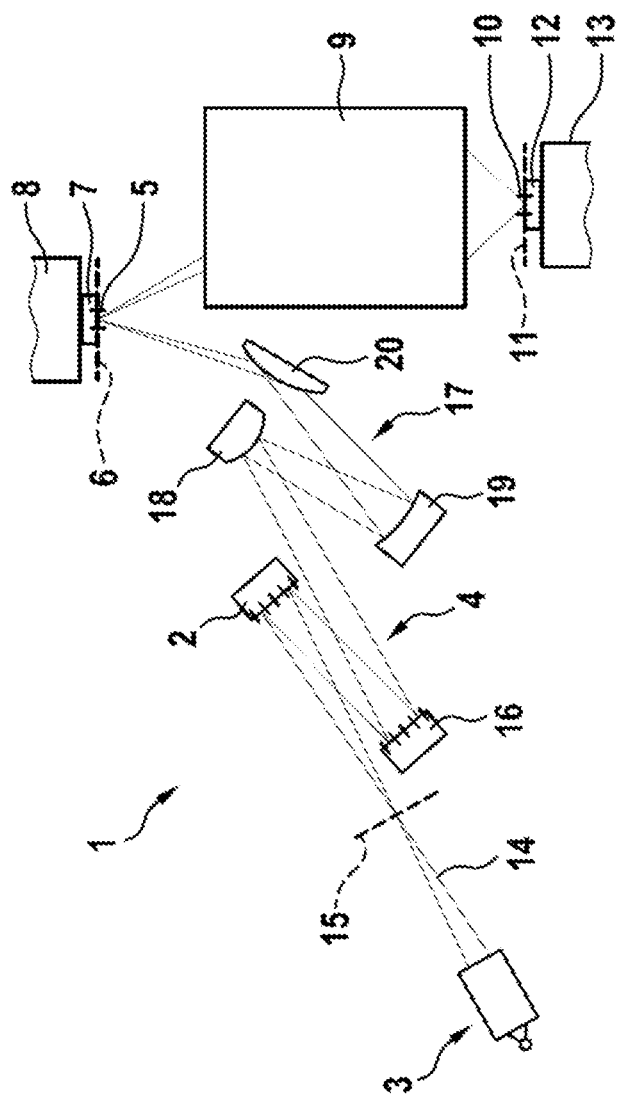
FIG. 1 shows a basic construction of an EUV projection exposure apparatus.

FIG. 1 shows an example of the basic construction of a microlithographic EUV projection exposure apparatus 1 in which the disclosure can be used. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7, which is arranged in the object field 5 and held by a schematically illustrated reticle holder 8, is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly illustrated wafer holder 13. The light source 3 can emit used radiation, for example, in a wavelength range of between 5 nm and 30 nm.

The disclosure can likewise be used in a DUV apparatus, which is not explicitly shown here. A DUV apparatus is set up in principle like the above-described EUV apparatus 1, wherein mirrors and lens elements can be used as optical elements in a DUV apparatus and the light source of a DUV apparatus emits used radiation in a wavelength range from 100 nm to 300 nm.

Figure 2:
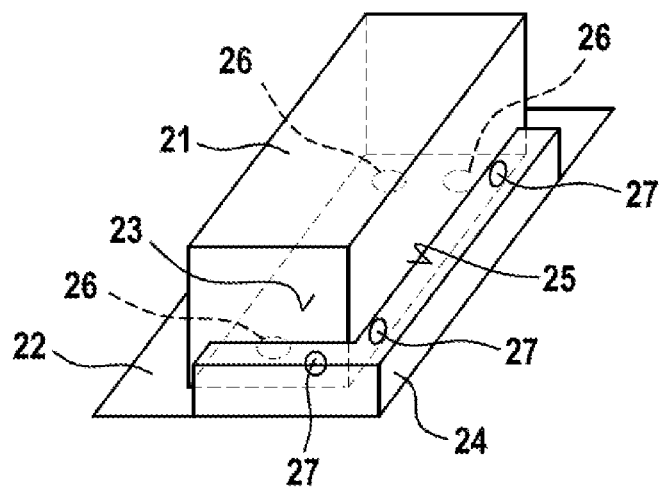
FIG. 2 shows a known arrangement.

FIG. 2 shows a sensor 21, which, in the example shown, is arranged on a sensor frame 22 as structural part of a lithography apparatus according to the prior art. The sensor frame 22 serves as a reference for the positioning of the mirrors from FIG. 1. The sensor 21 is used to ascertain the position and orientation of a mirror in relation to the sensor frame 22 and thus also in relation to other mirrors, the position and orientation of which are likewise determined in relation to the same sensor frame 22. The alignment of such a sensor is a factor in the accuracy of the determination of the position and orientation of the mirror and therefore is itself desirable relatively accurate and relative reproducible.

For this purpose, the sensor frame 22 shown in FIG. 2 exhibits, on that plane on which the sensor 21 is secured (referred to hereinafter as securing plane 23), an L-shaped elevation 24 going beyond the securing plane. The two sides of the L-shaped elevation 24 which are perpendicular to the securing plane 23, and which are directed toward the sensor 21, and the securing plane 23 of the sensor 21 together form a cube corner that the sensor 21 contacts, that is to say mechanically touches, with three sides. The three sides of the cube corner serve as reference surfaces 25 for aligning the sensor 21 in space.

These three planes determine the orientation of the sensor 21 on the sensor frame 23 in all 6 degrees of freedom.

The first side of the sensor 21, which is the side by which the sensor 21 touches the securing plane 23, has three screw-on points 26, by which the sensor 21 is secured on the securing plane 23. In contrast to the first side, the second side of the sensor 21, which is directed toward the short side of the L-shaped elevation 24, has a stop, not illustrated in the figure, by which the sensor 21 touches the reference surface 25. The third adjacent side, which is directed toward the long side of the L-shaped elevation 24, has two stops, likewise not illustrated in the figure, both of which touch the reference surface 25 at the stop points 27. In this exemplary embodiment, the sensor 21 has six contact points with the sensor frame 22.

The above-described reference surfaces 25 and the securing plane 23 of the sensor frame 22 and also the stops of the sensor 21 are subject to manufacturing fluctuations which can have the effect that, after the securing of the sensor 21, wherein all stops of the sensor 21 touch the reference surfaces 25 and also the three screw-on points 26 touch the securing plane 23, that is to say all six contact points of the sensor 21 bear against the sensor frame 22, the position and alignment of the sensor 21 are not sufficiently accurate. In order to compensate for the manufacturing tolerances, therefore, all six contact points of the sensor 21 are desirably adjustable. The adjustment of the contact points is usually realized with spacers. The spacers are very accurately manufactured washers, also called spacers. The thickness of the spacers for the six contact points is calculated individually for each pairing of sensor 21 and sensor frame 22.

The contact between the sensor 21 and the sensor frame 22 at six points can give rise to stresses during the screwing of the sensor 21. The stresses can change over time, the position of the sensor 21 relative to the sensor frame 22 changing in turn. This change over time, which is also referred to as drift, is disadvantageous in so far as its presence means that it is no longer possible to satisfy increasing desired properties with respect to drift stability of the sensors 21 for systems of the newest generation.

In lithography apparatuses, by way of example, linear scales, capacitive sensors or interferometers can be used as sensors. In the case where an interferometer is used, which often has to measure a large distance between the reference surface of the sensor 21 and the reference surface of the object to be measured, for this reason this already results in relatively stringent desired properties with respect to the accuracy of the alignment of the interferometer relative to the measurement object, but also with respect to the temporal stability of the orientation of the interferometer on the sensor frame 22. Therefore, any change in the orientation of the interferometer on the sensor frame 22 over time in the light direction results in a corruption of the measurement value and thus of the measured position of the measured component. Against this background, one disadvantage of the arrangement shown in FIG. 2 is that as a result of the interferometer being screwed to the sensor frame 22, mechanical stresses initially arise, which relax over the course of time and this means that it is no longer possible to satisfy the increasing desired properties with respect to the temporal stability of the distance measurement over time.

Figure 3:
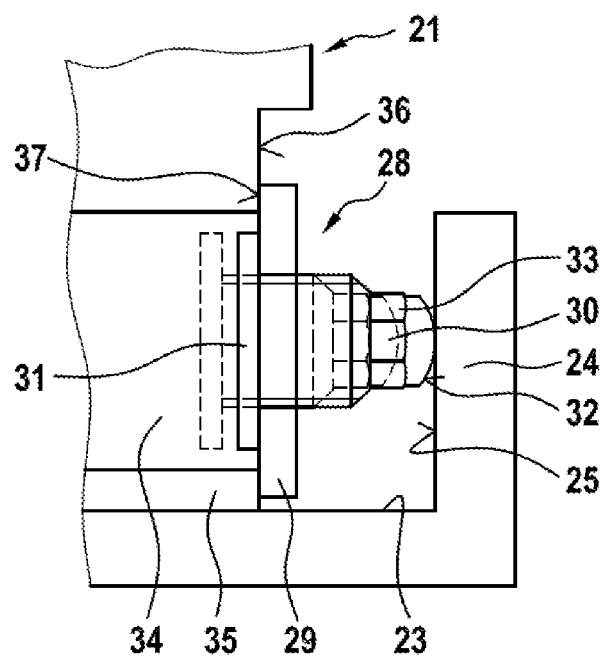
FIG. 3 shows an embodiment of the disclosure.

FIG. 3 shows a first embodiment of the disclosure. In the embodiment shown, the stresses that remain in the sensor as a result of the contact between the sensor and the sensor frame at all six contact points even after the screwing of the sensor are released by virtue of the fact that the three stops 28, which, as shown in FIG. 2, serve for positioning the sensor in the cube corner, after the sensor has been screwed on the securing plane 23 of the sensor frame, are adjusted such that they are no longer in contact with the reference surfaces 25 of the L-shaped elevation 24 of the sensor frame, that is to say no longer touch the reference surface 25. The stresses possibly introduced into the sensor as a result of the screwing are released as a result. The change in the position of the sensor and/or in the alignment thereof relative to the sensor frame, which change arises as a result of the stresses being released, can be compensated for by a calibration of the system. The calibration can be carried out outside production operation of the semiconductor lithography apparatus.

The first embodiment of a stop 28 according to the disclosure as depicted in FIG. 3 includes a stop mount 29 or mount and a stop screw 30. In this case, the stop 28 is arranged in a recess 34 in a baseplate 35 of a sensor 21, which is not illustrated in its entirety in the figure. Sensor 21 and stop 28 are in mechanical contact with one another via the sensor-side interface surface 36 and the stop-side interface surface 37. The stop screw 30 has a screw head 31 at the first end of its shaft and a contact surface 32 at the second end of the shaft, the contact surface being embodied in a convex fashion in the example shown. The convex embodiment of the contact surface 32 results in an advantageous point contact between the contact surface 32 and the reference surface 25 of the sensor frame. The solid lines show the position of the stop screw 30 in the mount 29 before the sensor is screwed to the sensor frame, that is to say that the contact surface 32 bears against the reference surface 25. The stop screw 30 is screwed into the mount 29 to an extent such that the underside of the screw head 31 bears on the side of the mount 29 facing it and is pressed on there, that is to say touches the latter areally. This side of the mount 29 is thus the reference surface for the head 31 of the stop screw 30 in a completely screwed-in position.

The dashed lines in FIG. 3, in so far as they are not covered by the solid lines, show the position of the stop screw 30 after the sensor 21 has been screwed to the sensor frame and the stop screw 30 has been screwed out of the mount 29 to an extent such that the contact surface 32 of the stop screw no longer touches the reference surface 25 of the sensor frame.

The stop screw 30 in the exemplary embodiment shown in FIG. 3 includes a hexagon 33 formed on the circumference at a region of the shaft adjacent to the convex contact surface. Other shaped elements can also be fitted to the shaft of the stop screw, which elements, like the hexagon 33, can serve as an engagement region for an appropriate key.

The stresses that have possibly been frozen as a result of the screwing of the sensor 21 on the sensor frame can be released directly after screwing with the arrangement shown in the figure. Relaxation of the stresses over time, which would change the reference of the sensor 21, is thus advantageously avoided and the need for renewed calibration of the sensor 21 is virtually precluded.

If, after screwing for the first time, the position and orientation of the sensor 21 with respect to the sensor frame are not yet optimal and a stop screw having a different length is used, the stop screw 30 illustrated in FIG. 3 can be screwed out of the mount and be replaced by a different stop screw having the desired length.

Figure 4:
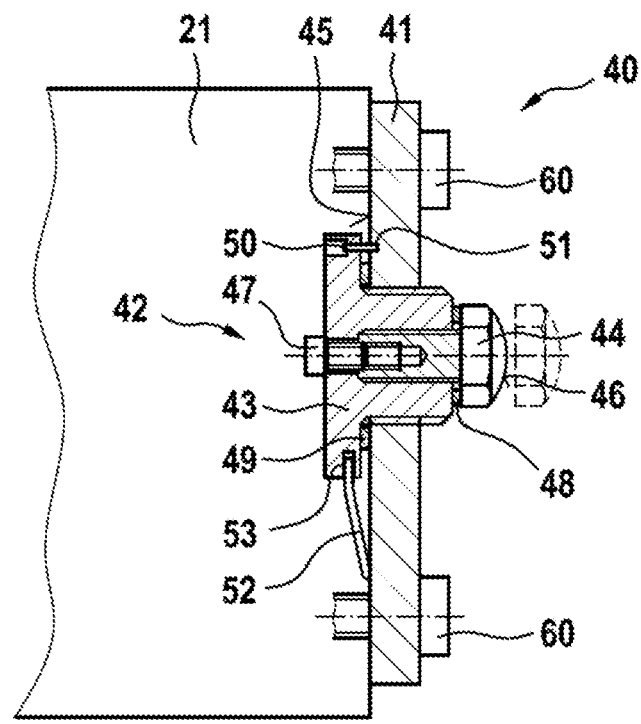
FIG. 4 shows an embodiment of the disclosure.

FIG. 4 illustrates a further embodiment of the disclosure in detail. The stop 40 shown in FIG. 4 includes a stop mount 41 and a stop screw 42, which in turn includes an adjustment screw 43 and a contact screw 44. In the example shown, the stop mount is secured to the sensor 21 using the screws 60.

In the mount shown in FIG. 4, the stop screw 42 is illustrated in the screwed-in state, that is to say with the underside of its head pressed fixedly onto the interface surface 45 of the mount. As already mentioned, in the example shown, the stop screw 42 includes a first part, the adjustment screw 43, and a second part, the contact screw 44, which is screwed in an internal thread formed in the shaft of the adjustment screw 43. For its part, the adjustment screw 43 is screwed by its external thread formed on the shaft in an internal thread formed in the mount 41.

The adjustment screw 43 can thus be moved relative to the mount 41, on the one hand in order to be screwed into the mount 41 until the underside of the screw head is in contact with the interface surface 45 of the mount 41 and is pressed onto the latter, and on the other hand in order to screw the adjustment screw 43 out of the mount 41, in order to exchange the latter or, after the sensor has been screwed to the sensor frame, to release the convex contact surface 46 from the reference surface of the sensor frame, thereby creating a distance between the contact surface 46 and the reference surface in order to reduce possible stresses produced by the sensor being screwed to the sensor frame.

Advantageously, as a result of the bipartite construction of the stop screw 42 as shown in FIG. 4, the length of the stop screw 42 can be varied by the contact screw 44 being screwed out or screwed in. In the event of the possibly involved adaptation of the length of the stop screw 42 for the optimum positioning of the sensor on the sensor frame, it is thus possible to use a single type of stop screws, which significantly reduces stock-keeping.

In order to fix the contact screw 44 after the desired length has been set, the thread can be braced; this can be achieved with a force which acts on the shaft of the contact screw 44 and which causes the sidewalls of the external thread of the contact screw 44 to be braced against the sidewalls of the internal thread of the adjustment screw 43, thus giving rise to a frictional engagement between the two thread sidewalls, which in turn prevents undesired rotation. For the purpose of such bracing of the contact screw 44 with the adjustment screw 43, it is possible to use a so-called locking screw 47, as illustrated in FIG. 4. The locking screw is led through a through hole in the head of the adjustment screw 43 and screwed in an internal thread introduced in the shaft of the contact screw 44. As a result, the external thread of the contact screw 44 can be braced with the internal thread of the adjustment screw 43 independently of the screw-in depth and rotation can thus be avoided. The force for bracing the thread can also be realized by an arrangement, not explicitly shown in the present case, having a spring that presses onto the shaft of the contact screw 44.

Alternatively or additionally, the length of the stop screw 42 can also be varied using washers 48 between contact screw 44 and adjustment screw 43, as likewise indicated in FIG. 4. Depending on the desired properties with respect to the length of the stop screw 42, the washers 48, also called spacers, are ground to a specific thickness and then positioned between the head of the contact screw 44 and the adjustment screw 43.

Alternatively or additionally, as likewise shown in FIG. 4, it is also conceivable to provide washers 49 between the adjustment screw 43 and the interface surface 45 of the mount 41, such that although the length of the stop screw 42 cannot be adjusted, the relative position of the contact surface 46 with respect to the interface surface 45 of the mount 41 can indeed be adjusted.

Bracing the thread between contact screw 44 and adjustment screw 43 is achieved in the first case by the contact screw 44 being screwed into the adjustment screw 43 as far as the stop and the head of the contact screw 44 being pressed onto the shaft of the adjustment screw 43 or the washer 48.

In the completely screwed-in state of the adjustment screw 43, the latter is screwed as far as the stop of the screw head onto the washer 49 or the mount 41, thereby ensuring the bracing of the thread. A locking screw is not necessary in this case.

After the adjustment screw 43 has been turned back, it is no longer protected against undesired rotation as a result of vibrations occurring during the operation of the apparatus.

Advantageously, it is also possible to provide an anti-rotation safeguard at the screw head of the adjustment screw 43, which, as illustrated in FIG. 4, can be embodied for example either by a spring-loaded pin 50 as elastically movable element through the screw head, which latches into a cutout 51 provided in the interface surface 45 of the mount 41, or by a spring 52 secured in the interface surface 45 of the mount, which spring in turn as elastically movable element latches into a cutout 53 provided on the circumference of the screw head. Both variants shown prevent a further rotation of the stop screw 42 and thus contact between the contact surface 46 of the stop 40 and the reference surface, or else complete turning of the stop screw 42 out of the mount 41. This solution can also be used for the integral stop screw 30 shown in FIG. 3.

The possibilities shown in FIG. 4 and described further above should be regarded by way of example for further implementations of the disclosure which make it possible for example to change the length of the stop screw 42 without having to remove the stop from the component or the structural part, that is to say from outside. The solution in which a washer 48 or a spacer is employed between the contact screw 44 and the adjustment screw 43 can be realized without unscrewing the stop from the sensor if, besides the contact screw head embodied as a hexagon, for example, a possibility is also provided for fixing the adjustment screw in order to realize a movement, such as, for example, a rotation, of the contact screw and the adjustment screw relative to one another.

Figure 5:
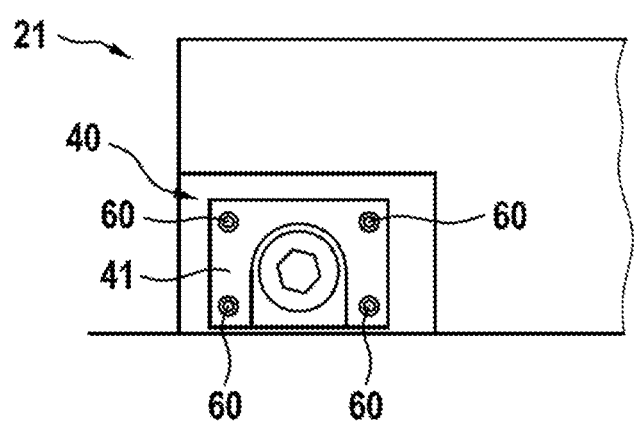
FIG. 5 shows a plan view of a sensor and a stop secured to the sensor.

FIG. 5 shows a plan view of the sensor 21 and the stop 40 secured to the sensor 21. In the example shown, the mount is secured to the sensor 21 using four screws 60. It is also possible to secure the stop 40 on the part of the structural part such as a sensor frame, for example, and to form the corresponding reference surfaces on the sensor. This arrangement is functionally identical and is influenced by other criteria such as structural space or accessibility of the component and/or the structural part. The form of the mount 41 and the type of screwing, that is to say the number and arrangement of the screws 60, are by way of example and can also be embodied in any other form.

Figure 6:
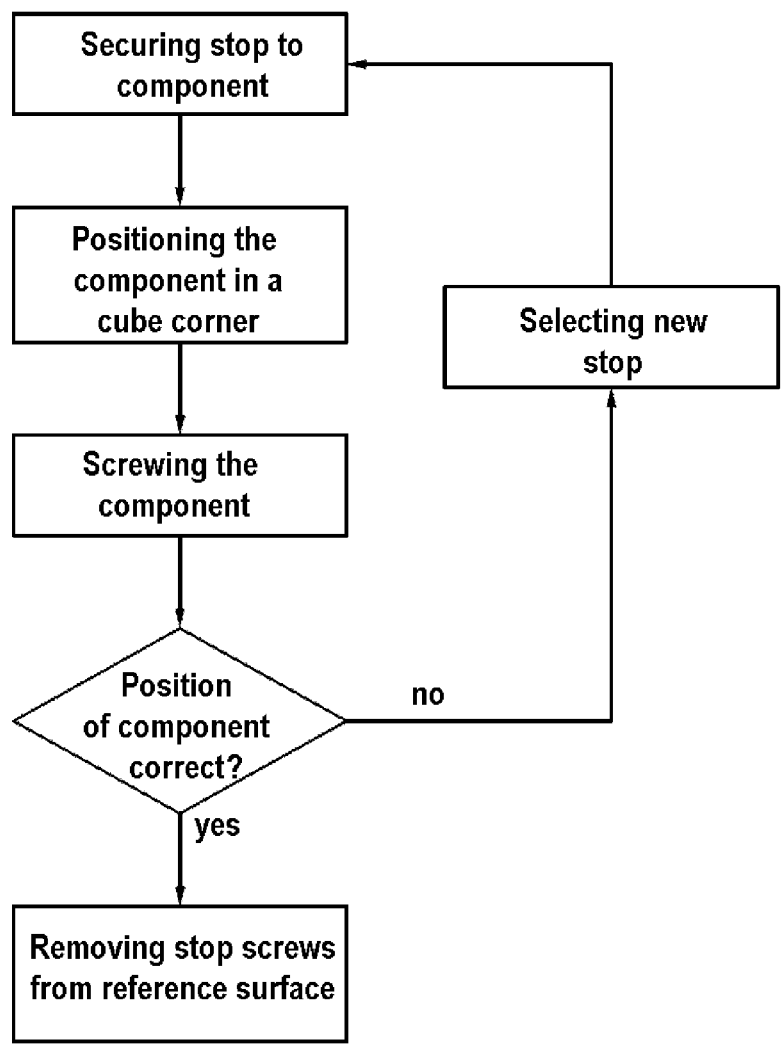
FIG. 6 shows a flow diagram for an adjustment method.

FIG. 6 shows a possible method by which the apparatus according to the disclosure in FIGS. 3-5 is arranged for adjustment and stress-free mounting of components on structural parts.

The method steps shown in the figure are preceded by the definition of the length of the individual stops and the mounting of the stop screws into the mount of the stop to the degree to which the screw head bears on the interface surface of the mount over the whole area.

In a first method step, the stops previously mounted in this way are secured to the component at the screw-on points provided therefor.

In the second method step, the component is pushed into the reference stops provided for mounting, that is to say the cube corner.

In a third method step, the component is screwed to the structural part at its screwing points.

In a fourth method step, the position of the sensor is checked and, if appropriate, steps 1 to 3 are repeated with a different stop screw.

In a fifth method step, the stop screws are screwed out of the mount and the contact that exists between the stops and the reference surfaces is thus cancelled, as a result of which the stresses possibly frozen as a result of the screwing are released.

LIST OF REFERENCE SIGNS

1 Projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate focal plane
16 Pupil facet mirror
17 Assembly
18 Mirror
19 Mirror
20 Mirror 21 Component, sensor
22 Structural part, sensor frame
23 Securing plane
24 Elevation
25 Reference surface
26 Screw-on point
27 Stop point
28 Stop
29 Mount
30 Stop screw
31 Screw head
32 Contact surface
33 Hexagon
34 Recess
35 Baseplate
36 Sensor-side interface surface
37 Stop-side interface surface
40 Stop
41 Mount
42 Stop screw
43 Adjustment screw
44 Contact screw
45 Interface surface of the mount
46 Contact surface
47 Locking screw
48 Washer
49 Washer
50 Elastically movable element
51 Cutout
52 Elastically movable element
53 Cutout
60 Screw

What is claimed is:

1. An apparatus, comprising:
a component;
a structural part;
a first element; and
a stop comprising a mount and a member in the mount, wherein:
the member is movable so that:
in a first configuration of the apparatus, the member bears against a reference surface at the structural part and/or the component, and the first element is configured to fix the component in the first position relative to the structural part;
in a second configuration of the apparatus, the member does not bear against the reference surface and the component remains fixed in the first position relative to the structural part; and
the apparatus is a semiconductor lithography projection exposure apparatus.

2. The apparatus of claim 1, wherein the member comprises a contact surface.

3. The apparatus of claim 1, wherein the member comprises a convex contact surface.

4. The apparatus of claim 3, wherein the member has an adjustable length.

5. The apparatus of claim 4, wherein the member comprises an adjustment screw and a contact screw.

6. The apparatus of claim 5, wherein the member is configured so that turning the contact screw changes the length of the member.

7. The apparatus of claim 6, further comprising a locking screw configured to fix the contact screw in the adjustment screw.

8. The apparatus of claim 7, further comprising a device configured to fix the member after its movement away from the reference surface.

9. The apparatus of claim 8, wherein:
the device comprises a second element comprising an elastically movable element and a cutout to receive the elastically movable element; and
the device is configured so that one of the following holds:
the elastically movable element is movable through a head of the adjustment screw and the cutout is in an interface surface of the mount so that the elastically movable element latches in the cutout to fix the member; and
the elastically movable element is secured in the interface surface of the mount and the cutout is on a circumference of the head of the adjustment screw so that the elastically movable element latches in the cutout to fix the member.

10. The apparatus of claim 1, wherein the member has an adjustable length.

11. The apparatus of claim 1, wherein the member comprises an adjustment screw and a contact screw.

12. The apparatus of claim 11, wherein the member is configured so that turning the contact screw changes a length of the member.

13. The apparatus of claim 12, further comprising a locking screw configured to fix the contact screw in the adjustment screw.

14. The apparatus of claim 13, further comprising a device configured to fix the member after its movement away from the reference surface.

15. The apparatus of claim 12, further comprising a locking screw configured to fix the contact screw in the adjustment screw.

16. The apparatus of claim 14, further comprising a device configured to fix the member after its movement away from the reference surface.

17. The apparatus of claim 16, wherein:
the device comprises a second element comprising an elastically movable element and a cutout to receive the elastically movable element; and
the device is configured so that one of the following holds:
the elastically movable element is movable through a head of the adjustment screw and the cutout is in an interface surface of the mount so that the elastically movable element latches in the cutout to fix the member; and
the elastically movable element is secured in the interface surface of the mount and the cutout is on a circumference of the head of the adjustment screw so that the elastically movable element latches in the cutout to fix the member.

18. The apparatus of claim 1, further comprising a device configured to fix the member after its movement away from the reference surface.

19. A method, comprising:
securing a stop to a member selected from the group consisting of a semiconductor lithography projection exposure apparatus component and a structural part the semiconductor lithography projection exposure apparatus;
positioning the component so that the stop comes into mechanical contact with a reference surface at the component or the structural part; and
using a screw to fix the component in a first position relative to the structural part; and after fixing the component in the first position relative to the structural part, moving the stop away from the reference surface while the component maintains the first position relative to the structural part.

20. The apparatus of claim 1, wherein the component comprises a sensor.

21. The apparatus of claim 20, wherein the apparatus comprises a sensor frame supporting the sensor, and the sensor frame comprises the structural part.

22. The apparatus of claim 1, wherein the member comprises a stop screw.

23. The apparatus of claim 1, wherein the first element comprises a screw.

* * * * *